United States Patent [19]

Inoue

[11] 4,431,938
[45] Feb. 14, 1984

[54] GROOVED PIEZOELECTRIC RESONATING ELEMENT AND A MOUNTING THEREFORE

[75] Inventor: Jiro Inoue, Ishikawa, Japan

[73] Assignee: Murata Manufacturing Co., Ltd., Japan

[21] Appl. No.: 446,729

[22] Filed: Dec. 3, 1982

[30] Foreign Application Priority Data

Dec. 9, 1981 [JP] Japan .............................. 56-198785
Dec. 9, 1981 [JP] Japan .............................. 56-198786
Dec. 9, 1981 [JP] Japan .............................. 56-198787
Dec. 9, 1981 [JP] Japan .............................. 56-198788
Dec. 9, 1981 [JP] Japan .............................. 56-198789

[51] Int. Cl.$^3$ ............................................ H01L 41/08
[52] U.S. Cl. ................................... 310/348; 310/366; 310/368; 310/355
[58] Field of Search .............................. 310/366–368, 310/348, 354–356

[56] References Cited

U.S. PATENT DOCUMENTS 2,543,500 2/1951 Kettering et al. .............. 310/368 X
4,336,510 6/1982 Miyamori ....................... 310/366 X
4,370,583 1/1983 Ljung ............................. 310/367 X

FOREIGN PATENT DOCUMENTS 832608 4/1960 United Kingdom ............... 310/368

*Primary Examiner*—Mark O. Budd
*Attorney, Agent, or Firm*—Ostrolenk, Faber, Gerb & Soffen

[57] ABSTRACT

A piezoelectric resonating element includes a piezoelectric plate (2) having an elongated rectangular shape with first and second major flat surfaces. The piezoelectric plate (2) is formed with an elongated groove (3) on the first major flat surface extending in an lengthwise direction of the piezoelectric plate (2) to separate the first major flat surface into first and second lands. A first electrode (6) is deposited on the first land, and a second electrode (7) is deposited on the second land. A third electrode (12) is deposited entirely on the second major flat surface. A dicing saw is used to form the groove and cut out the element from a mother piece. A piezoelectric resonating device employs the piezoelectric resonating element and it includes a base (14) for supporting the piezoelectric resonating element (1), first, second and third terminals connected to the element (1) for the external connection, a casing (18) for receiving the base (14), piezoelectric resonating element (1) and first, second and third terminals, and a sealant (35) applied at at an opening (32) of the casing (18).

13 Claims, 26 Drawing Figures

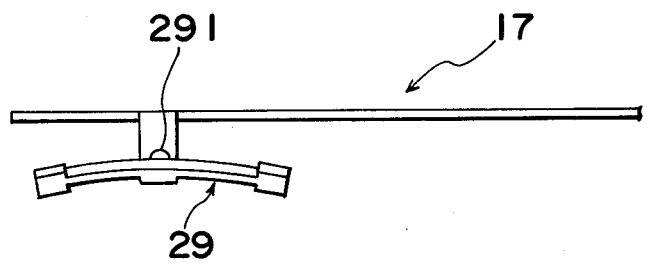
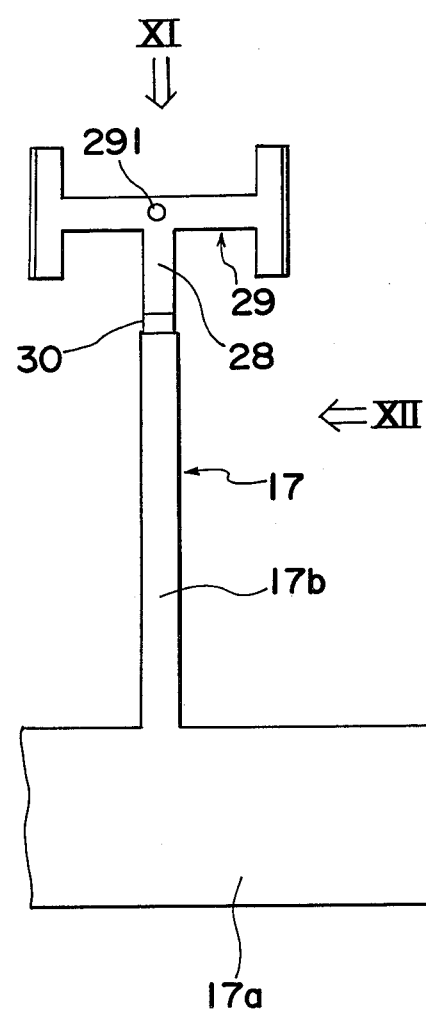
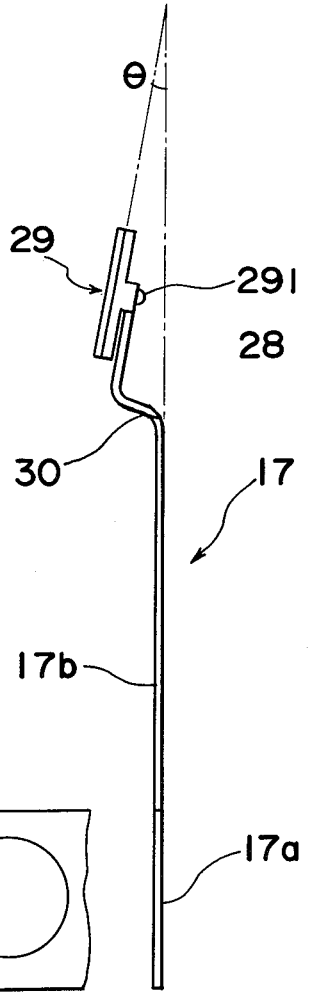

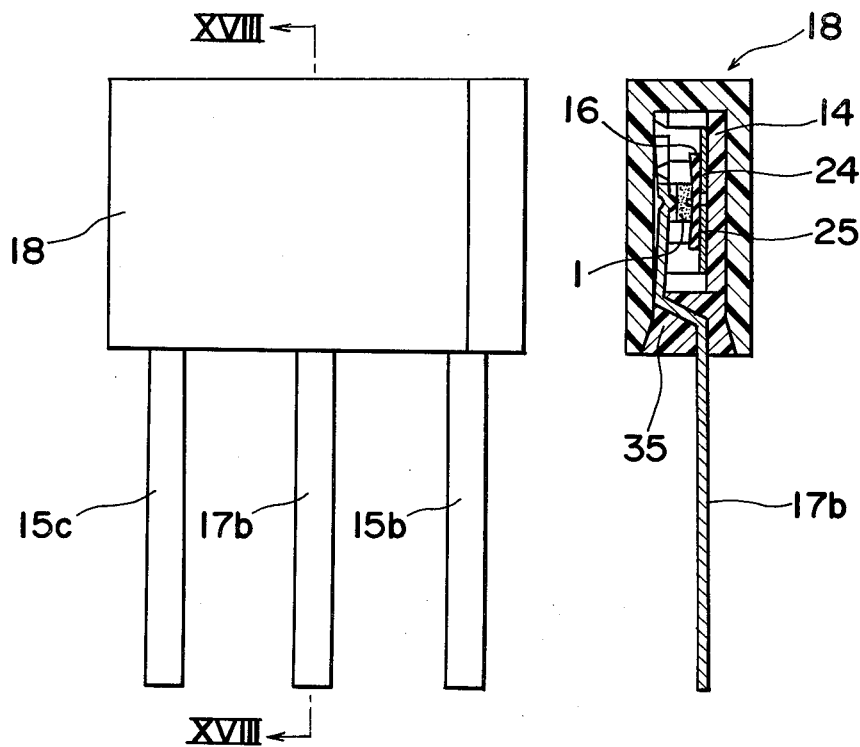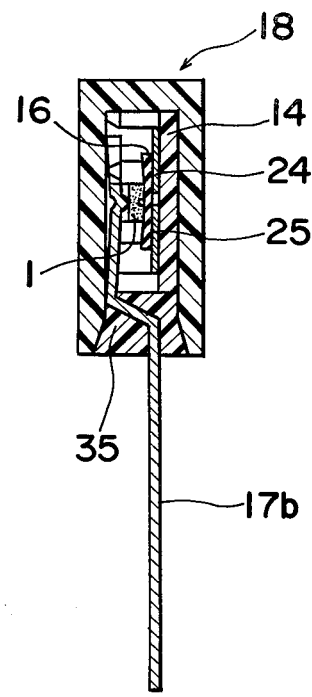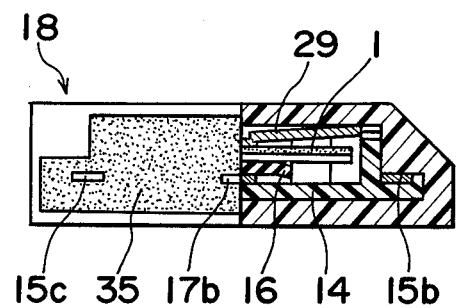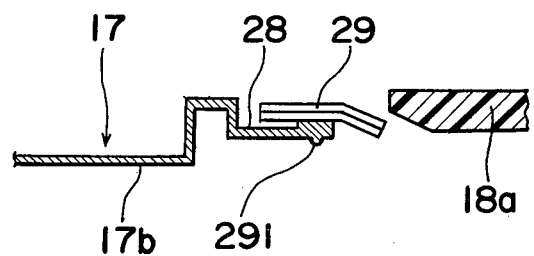

GROOVED PIEZOELECTRIC RESONATING ELEMENT AND A MOUNTING THEREFORE

BACKGROUND OF THE INVENTION

1. Field of the Invention

The present invention relates to a piezoelectric resonating element, a piezoelectric resonating device employing such an element and also to a method for manufacturing such an element.

2. Description of the Prior Art

Generally, the piezoelectric resonating element includes a piezoelectric body and electrodes deposited on the piezoelectric body, while the piezoelectric resonating device includes a casing in which the piezoelectric resonating element is accommodated and terminals connected to the electrodes for the external connection.

The piezoelectric resonating device is, for example, used in a filter of a receiver for receiving AM signal having a central frequency of several 100s KHz, such as 450 KHz. According to the prior art, the arrangement of such a filter can be divided into three types from the view point of mass-production.

The first type is Jaumann type filter which requires an IF (intermediate frequency) transformer and, therefore, has such disadvantages that (i) the impedance matching between the IF transformer and the piezoelectric resonating element is very difficult, (ii) since the transformer includes coils, the inductance varies greatly and, therefore, it is less reliable, and (iii) the employment of the transformer results in bulky in size, and high manufacturing cost. An example of Jaumann type filter is disclosed in the specification of Japanese Utility Model Publication (Jikkosho) No. 47-40256 issued Dec. 6, 1972.

The second type is a 3-terminal type filter which has a shape of square plate and vibrates under expansion mode, or has a shape of circle plate and vibrates under radial expansion mode. The 3-terminal type filter takes such disadvantages that (i) it has a relatively large size, particularly in the case where the third harmonics in the circle plate filter is utilized, the size of the circle plate filter would be considerably large to obtain node points to support the circle plate filter, and (ii) in the case of rectangular plate, unwanted spurious modes of vibrations are produced by the edge mode of vibration. An example of the second type is disclosed in the specification of U.S. Pat. No. 4,360,754 issued Nov. 23, 1982 to Isao Toyoshima et al.

The third type is a filter that has a pair of elongated rectangular plates and vibrates in lengthwise direction under double-mode in which the frequency of vibration between the two plates is slightly different. This type of filter has such disadvantages that (i) it is difficult to adjust the vibrating frequency of each rectangular plate and the coupling between the two rectangular plates, (ii) its structure is complicated, and (iii) its manufacturing cost is high. An example of the third type is disclosed in the specification of Japanese Utility Model Publication (Jikkosho) No. 56-19465 issued May 8, 1981.

SUMMARY OF THE INVENTION

The present invention has its essential object to present a novel type of piezoelectric resonating element which is structurally utterly different from any of the prior art type described above and which has various advantageous features.

It is also an essential object of the present invention to provide a novel type of piezoelectric resonating device employing the novel type of piezoelectric resonating element.

It is also an essential object of the present invention to provide a method for manufacturing the novel type of piezoelectric resonating element.

It is a further object of the present invention to provide the novel type of piezoelectric resonating element in which the unwanted spurious mode of vibrations are suppressed.

It is a still further object of the present invention to provide the novel type of piezoelectric resonating element which has an excellent impedance characteristic.

It is another object of the present invention to provide the novel type of piezoelectric resonating element which is compact in size and can be manufactured at low cost.

It is a further object of the present invention to provide the novel type of piezoelectric resonating device in which the piezoelectric resonating element is sealed easily and effective.

It is yet another object of the present invention to provide the above described method for manufacturing the novel type of piezoelectric resonating element with high consistency.

It is a further object of the present invention to provide the above described method which is suitable for mass-production.

It is a still further object of the present invention to provide the above described method which is suitable for being applied in an automated assembly line.

BRIEF DESCRIPTION OF THE DRAWINGS

These and other objects and features of the present invention will become apparent from the following description taken in conjunction with preferred embodiments thereof with reference to the accompanying drawings, throughout which like parts are designated by like reference numerals, and in which:

FIG. 10 is a top plan view of a ground terminal member;

FIG. 11 is a front view of the ground terminal when viewed in a direction XI shown in FIG. 10;

FIG. 12 is a side view of the ground terminal when viewed in a direction XII shown in FIG. 10;

FIG. 17 is a top plan view of a piezoelectric resonating device of the present invention;

FIG. 18 is a cross-sectional view taken along a line XVIII—XVIII shown in FIG. 17;

FIG. 19 is a bottom view partly removed of the piezoelectric resonating device when viewed in a direction XIX shown in FIG. 17;

FIG. 20 is a diagrammatic view showing a modification of the ground terminal;

DESCRIPTION OF THE PREFERRED EMBODIMENTS

Figure 1A:
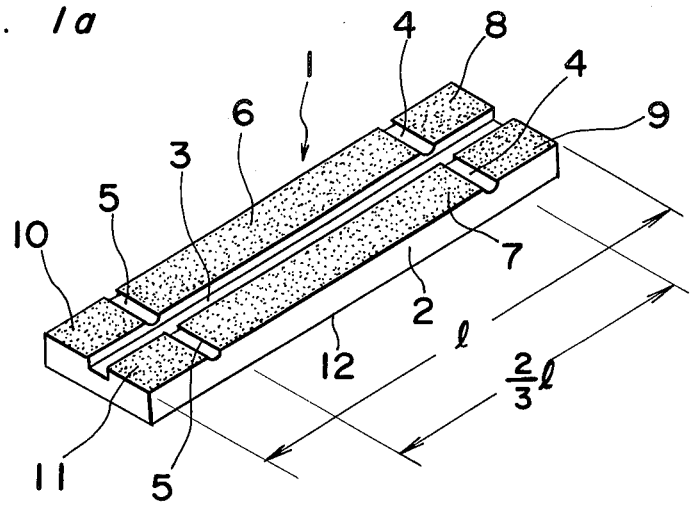
FIG. 1a is a perspective view of a piezoelectric resonating element according to a first embodiment of the present invention.

Referring to FIG. 1a, a piezoelectric resonating element 1 according to the first embodiment of the present invention comprises a piezoelectric ceramic plate 2 having an elongated rectangular shape with a length L. An upper major surface of the piezoelectric ceramic plate 2 is formed with a straight groove 3 that extends in a lengthwise direction for dividing the upper surface into two land portions. The upper major surface of the plate 2 is further formed with grooves 4 and 5, each intercepting the groove 3 and located a distance $\frac{1}{3}$ L away from the center of the upper major surface of the plate 2. Thus, the grooves 4 and 5 are spaced $\frac{2}{3}$ L away from each other. Therefore, by the grooves 3, 4 and 5, the major surface of the plate 2 is divided into six land sections on which electrodes 6, 7, 8, 9, 10 and 11 are deposited. The lower major surface of the piezoelectric ceramic plate 2 is entirely deposited with an electrode 12.

According to one example, the piezoelectric ceramic plate 2 has the length L about 4.05 mm, the width 0.6 mm, and the thickness 0.3 mm. Furthermore, the groove 3 has the depth 0.15 mm and the width 0.15 mm, and each of the grooves 4 and 5 has arbitrary size sufficient to provide an electric insulation of the electrodes 8, 9, 10 and 11 from the electrode 6 and 7. The electrodes 8, 9, 10 and 11 are provided merely to apply electric potential in thickness direction between the upper and lower major surface of the plate 2 during the manufacturing step of the piezoelectric resonating element 1 so as to polarize the plate 2, and thus, are not used during the operation. The piezoelectric resonating element 1 of the above example vibrates under lengthwise mode, in which the element 1 expands and contracts in lengthwise direction, with respect to an AM signal having the central frequency of 450 KHz.

Figure 1B:
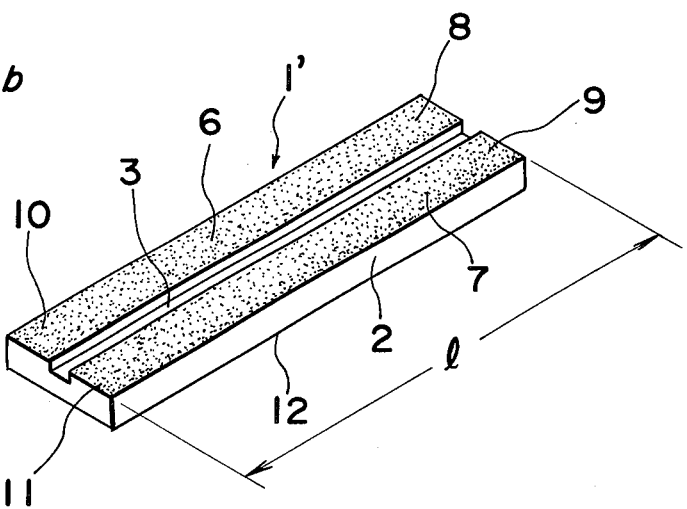
FIG. 1b is a perspective view of a piezoelectric resonating element according to a second embodiment of the present invention.

Referring to FIG. 1b, a piezoelectric resonating element 1' is shown according to a second embodiment. When compared with the element 1 of the first embodiment, the element 1' has no grooves 4 and 5 and, therefore, the upper major surface of the plate 2 is divided in to two lands on which electrodes 6 and 7 are deposited.

The piezoelectric resonating element 1', as well as the element 1, vibrates under single mode in lengthwise direction, and can be used as a filter element.

Figure 2:
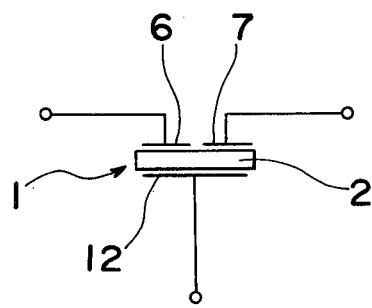
FIG. 2 is a symbolized circuit diagram of the piezoelectric resonating element of FIG. 1a or 1b.

Referring to FIG. 2, there is shown a symbolized diagram of the piezoelectric resonating element 1 or 1' of the present invention.

Next, the steps for manufacturing the piezoelectric resonating element 1 is described in connection with FIGS. 3 and 4.

First, a sintered ceramic plate 101 having a rectangular shape with the sides in several centimeters is so processed as to make the opposite major surfaces smooth by any known method, such as lapping. Such a sintered ceramic plate 101 serves as a mother piece. Then, each of the opposite major surfaces of the mother piece is entirely deposited with a thin film of electrically conductive material. Thereafter, a suitable voltage is applied between the thin films on the opposite surfaces to polarize the ceramic plate 101 in its thickness direction. Then, as shown in FIG. 4, by a dicing saw 13 having a cutting accuracy as high as ±2 micrometers, the plate 101 is formed with grooves and is cut into a plurality of chips, each cut-out chip defining the complete piezoelectric resonating element 1. To form the grooves, the dicing saw 13 rotating in high speed is put down in a direction B to a predetermined level and is advanced in a direction A. For cutting, the dicing saw 13 is further put down to lower level and is advanced in a similar manner. Although the dicing saw 13 is not suitable for use in cutting thick materials, the ceramic plate involved in the present invention is very thin and, thus, it can be simply cut by the dicing saw 13.

Figure 3:
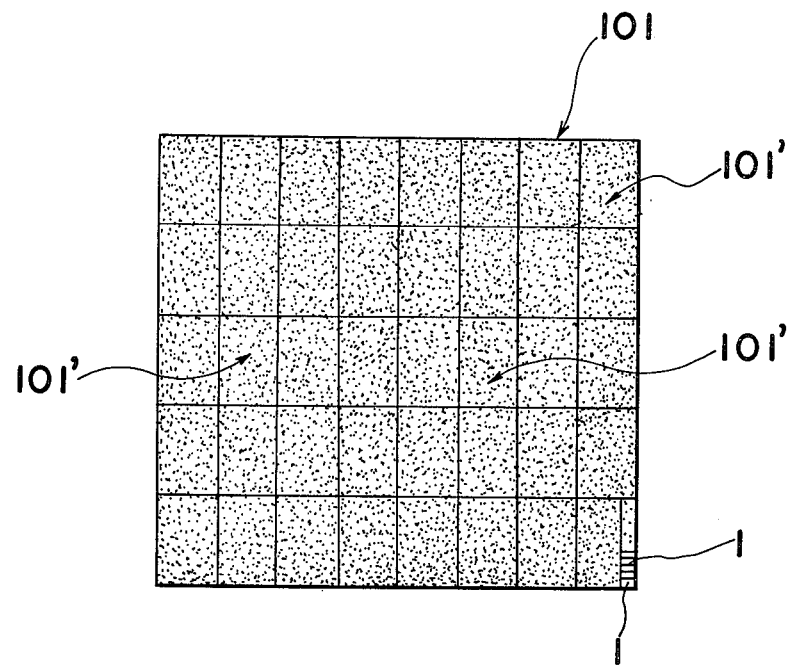
FIG. 3 is a plan view of a mass of sintered ceramic plates aligned vertically and horizontally in a plane.
Figure 4:
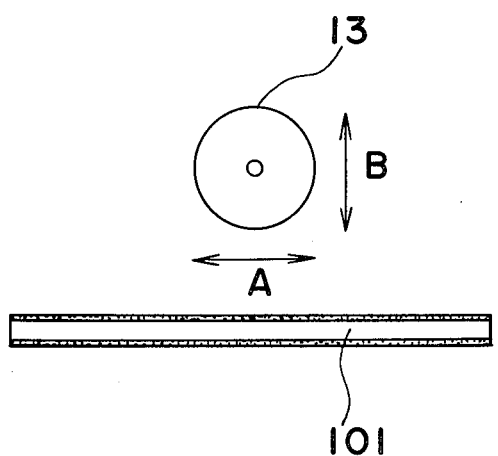
FIG. 4 is a diagrammatic view showing a manner for cutting the mass of sintered ceramic plates by a dicing saw.

In order to improve the efficiency of the manufacturing steps, a plurality of sintered ceramic plates 101 are aligned vertically and horizontally in a plane, as shown in FIG. 3. Thereafter, by the dicing saw 13, the plates 101 are altogether formed with grooves, and then, are cut into each plates 101 or directly into chips 1.

Since the dicing saw 13 has a high cutting accuracy, each cut-out chip 1 has a required length L so precise that there is no need to further adjust the size of the chip 1 and, thus, when compared with the prior art type of element, the adjustment for the frequency selection can be omitted. For example, in the case of cutting chips 1 for use in a filter with 455 KHz center frequency, each chip 1 showed high quality in the frequency selection and, the scattering of the frequency showed not more than 1.2 KHz. Furthermore, by cutting the grooves, which will serve as grooves 3, 4 and 5, the thin film can be formed into input and output electrodes 6 and 7 in a required size. In this respect, according to the prior art, the input and output electrodes 6 and 7 are formed by the steps of printing a predetermined pattern by a regist ink on the thin film, and thereafter, the thin film is partly etched away to define the electrodes 6 and 7. When compared with this, it can be said that the method according to the present invention is much simplied.

The grooves 4 and 5 are formed so as to obtain required length, i.e., $\frac{2}{3}$ L, for the electrodes 6 and 7. When the electrodes 6 and 7 are arranged to have the length $\frac{2}{3}$ of the length L of the plate 1, third harmonics can be suppressed.

Next, a piezoelectric resonating device employing the above described piezoelectric resonating element 1 is described.

Figure 5:
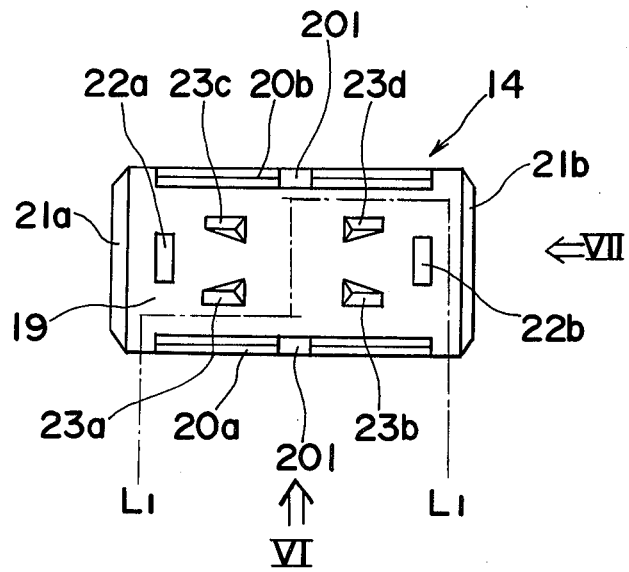
FIG. 5 is a top plan view of a base for supporting the piezoelectric resonating element and its associated parts.
Figure 7:
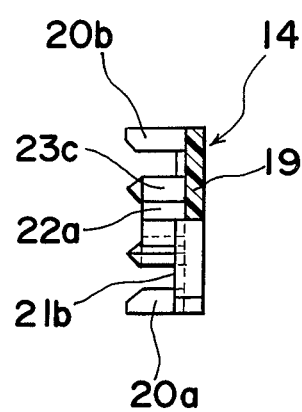
FIG. 7 is a side view partly removed of the base when viewed in a direction VII shown in FIG. 5.
Figure 6:
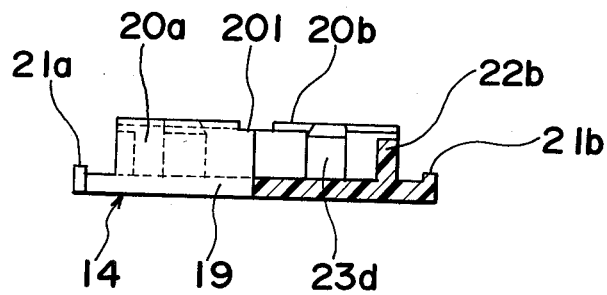
FIG. 6 is a front view partly removed of the base when viewed in a direction VI shown in FIG. 5.

Referring to FIGS. 5, 6, and 7, a base 14 is shown for supporting the piezoelectric resonating element 1 and its associated parts, such as terminal members 15 and 17, and conductive rubber sheet 16, as will be described in detail later.

The base 14 formed by an electrically non-conductive material, such as synthetic resin, is defined by a substrate 19 having a rectangular shape. Preferably, the four corners of the substrate 19 are cut away to remove the pointed edges, as best shown in FIG. 5. Along and at intermediate portion of the opposite long side edges of the substrate 19, two walls 20a and 20b stand up perpendicularly in face-to-face relation with each other from the substrate 19. A recess 201 is formed at the center of upper edge of each wall 20a, 20b. Similarly, along the opposite short side edges of the substrate 19, two walls 21a and 21b stand up perpendicularly in face-to-face relation with each other from the substrate 19. As shown in FIG. 6, the walls 20a and 20b are much taller than the walls 21a and 21b. Also, there are spaces provided between the tall and short walls.

In a space defined by the four walls 20a, 20b, 21a and 21b, there are six pins 22a, 22b, 23a, 23b, 23c and 23d extending perpendicularly from the substrate 19, in which the pins 22a and 22b are located adjacent to the short walls 21a and 21b, respectively, while the pins 23a and 23b are located adjacent to the tall wall 20a and the pins 23c and 23d are located adjacent to the tall wall 20b. As shown in FIGS. 6 and 7, the height of the pins 23a to 23d is the same as that of the tall walls 20a and 20b, and the height of the pins 22a and 22b is intermediate between the tall wall and the short wall. The top portion of the tall walls 20a and 20b and that of the tall pins 23a to 23d are pointed or tapered to facilitate the positioning of piezoelectric resonating element 1 and its associated parts on the substrate 19 in a manner described later. When viewed from top, as shown in FIG. 5, the base 14 has a symmetric shape, whereby in the assembly line, the base 14 can be held in the position shown in FIG. 5 or in up-side-down position.

Figure 8:
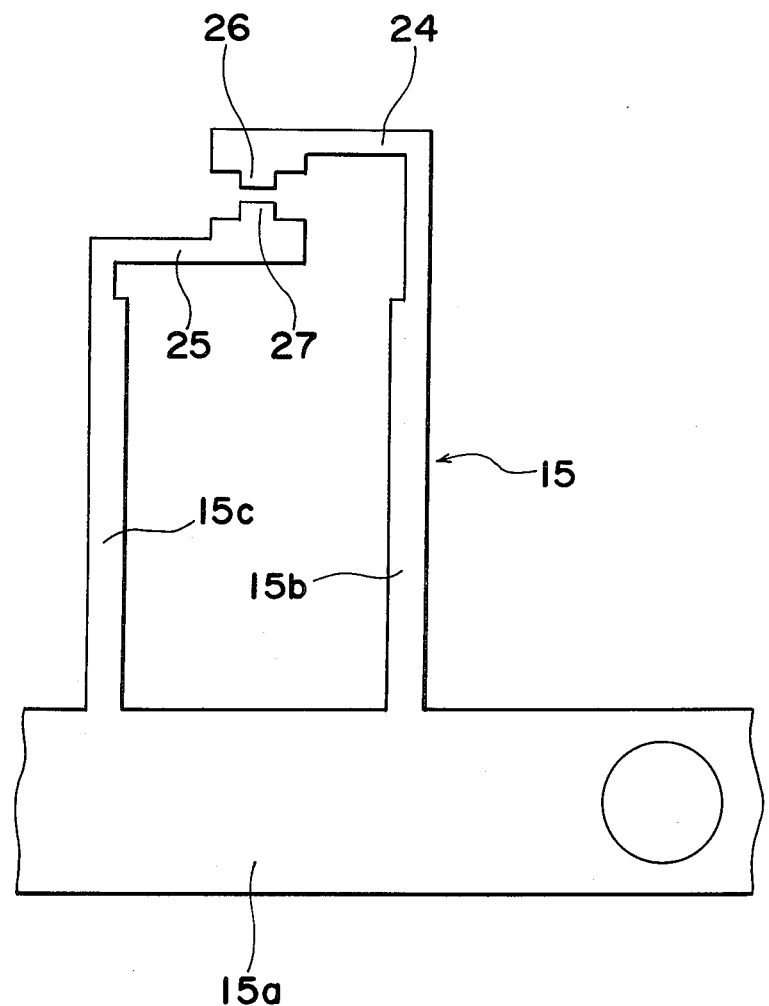
FIG. 8 is a plan view of terminal members.

Referring to FIG. 8, an input and output terminal plate 15 is shown, which comprises a belt 15a and a pair of arms 15b and 15c extending from the belt 15a. The arm 15b, which is longer than the arm 15c, has a beam 24 and, at the end of the beam 24, a contact face 26 is provided. Similarly, the shorter arm 15c has a beam 25 and a contact face 27 at the end of the beam 25. The contact faces 26 and 27 are located closely adjacent to each other with a predetermined space therebetween. The same pairs of arms (not shown) are further provided along the belt 15a in a predetermined pitch.

The input and output terminal plate 15 is accommodated in the base 14 in such a manner that the arm 15b where its width is narrowed is positioned in a spaced between the short wall 21b and the pin 22b, and the beam 24 is positioned in a space between the tall wall 20b and the pin 23d thereby locating the contact face 26 between the pins 23c and 23d. Similarly, the arm 15c where its width is narrowed is positioned in a space between the short wall 21a and the pin 22a, and the beam 25 is positioned in a space between the tall wall 20a and the pin 23a thereby locating the contact face 27 between the pins 23a and 23b. In brief, the terminal plate 15 is held in the base 14 along a chain line L1—L1 shown in FIG. 5.

It is to be noted that the reduced width portion of each of the arms 15b and 15c engages with the wall 20a to ensure the proper positioning of the terminal plate 15 in the base 14.

Figure 9:
FIG. 9 is a plan view of an anisotropic conduction pliable sheet.

Thereafter, an anisotropic conduction pliable sheet, such as a rubber sheet 16, as shown in FIG. 9, is placed on the terminal plate 15 in a bridged manner over the contact faces 26 and 27. The rubber sheet 16 has a rectangular shape and has a size capable of being placed in a space defined by the pins 23a, 23b, 23c and 23d. The rubber sheet 16 is made of silicone rubber and contains particles of electric conductive elements, such as graphite fibers or fine metallic lead lines, aligned in a thickness direction of the rubber sheet for allowing electric conduction only in its thickness direction.

On the rubber sheet 16, the piezoelectric resonating element 1 (FIG. 1) is mounted such that the electrodes 6 and 7 facing downward are held in contact with the rubber sheet 16. Thus, the electrodes 6 and 7 are electrically connected to contact faces 26 and 27, respectively through the rubber sheet 16 with a good electric insulation between the electrodes 6 and 7.

Figure 16:
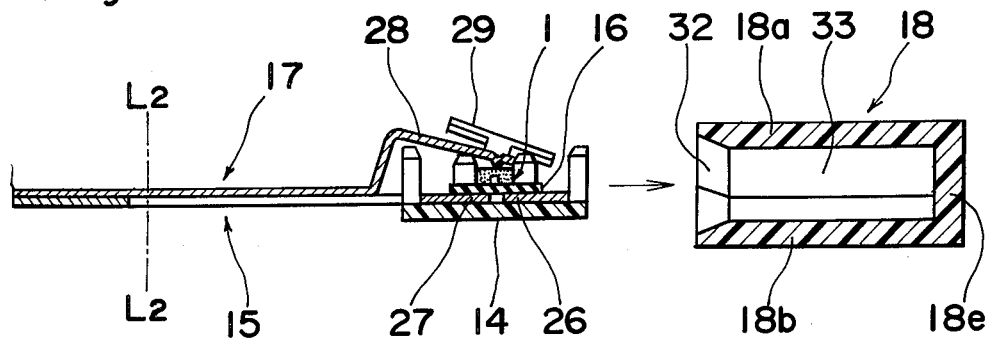
FIG. 16 is a cross-sectional exploded view of a piezoelectric resonating device of the present invention.

Mounted on the piezoelectric resonating element 1 is a ground terminal plate 17 which is shown in FIGS. 10, 11 and 12. The ground terminal plate 17 comprises a belt 17a and an arm 17b extending from the belt 17a. The arm 17b has a portion 30 bent in a shape of "S", as best shown in FIG. 12, and from the "S" portion 30 the arm further extends as indicated by a reference number 28. The arms 17b and 28 contain an acute angle $\theta$, such as 10°, as shown in FIG. 12. At the end of the arm 28, an "H" shaped bar 29 is provided. When viewed in a direction XI shown in FIG. 10, the "H" shaped bar 29 is arcuated, as shown in FIG. 11. Furthermore, at a joint between the arm 28 and the "H" shaped bar 29, a projection 291 is formed. When mounting the ground terminal plate 17, the projection 291 is held in contact with the electrode 12 of the element 1. In the assembly line, the belt 17a is held tightly against the belt 15a, as shown in FIG. 16, by a suitable means and, therefore, the rubber sheet 16 and the piezoelectric element 1 are temporarily held between the terminal plates 15 and 17 by the resiliency of the arm 28. When the base 14, rubber sheet 16, element 1 and terminals 15 and 17 are assembled in the above described manner (referred to as an assembled body), the assembled body is inserted into a casing 18.

Figure 13:
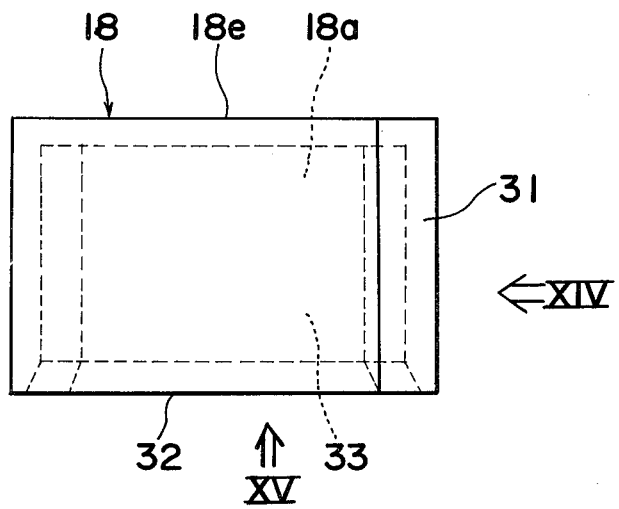
FIG. 13 is a top plan view of a casing.
Figure 14:
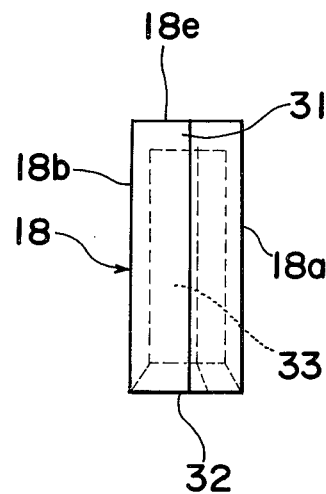
FIG. 14 is a side view of the casing when viewed in a direction XIV shown in FIG. 13.
Figure 15:
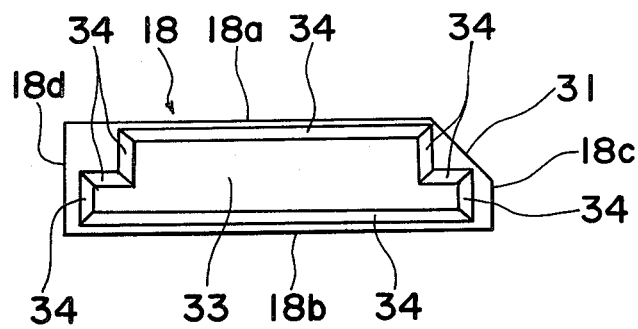
FIG. 15 is a front view of the casing when viewed in a direction XV shown in FIG. 13.

Referring to FIGS. 13, 14 and 15, the casing 18 has a rectangular configuration and is made of electrically non-conductive material, such as synthetic resin. The casing 18 is defined by top and bottom walls 18a and 18b, opposite side walls 18c and 18d and end wall 18e, thereby providing opening at 32 and defining a cavity 33 inside the casing 18. A cross-sectional configuration of the cavity 33 is the same as configuration of the opening 32, that is the center portion is as high as the tall wall 20a, 20b, and the opposite side portions, or wing portions, are as high as the short wall 21a, 21b. Preferably, the opening 32 is tapered by slanted walls 34 in a manner of funnel to facilitate the insertion of the above-mentioned assembled body. Also, it is preferable to provide a slanted face 31 on the outside of the casing 18 so that the top and bottom walls 18a and 18b can be easily detected during the manufacturing steps and also when in use.

The insertion of the assembled body in the casing 18 is carried out in such a manner that the substrate 19 of the base 14 slides on the bottom wall 18b of the casing 18 and the "H" shaped bar 29, particularly its two parallel portions slides on the top wall 18a of the casing 18. Since the two parallel portions of the "H" shaped bar 29 are slanted by a degree $\theta$, the leading end of such two parallel portions can be inserted into the casing 18 easily without any interference. During this insertion, the "H"

shaped bar 29 is pushed down and oriented in parallel relation to the top wall 18a and, accordingly, by the spring effect of the "H" shaped bar 29 the projection 291 is pushed down. Thus, the piezoelectric resonating element 1 and the conductive rubber sheet 16 are held between the terminal plates 15 and 17, more particularly between the each of the contact faces 26 and 27 and the projection 291, with a predetermined pressure. Such a pressure is present from the start of insertion by the resiliency of the arm 28 and increases during the insertion. When the assembled body is completely inserted into the casing 18, the pressure attains the predetermined level determined by the spring effect of the "H" shaped bar 29 and the elasticity of the rubber sheet 16. Thus, the piezoelectric resonating element 1 and the rubber sheet 16 are held between the terminal plates 15 and 17 not only when they are completely inserted into the casing 18 but also during the insertion into the casing 18. Thus, the piezoelectric resonating element 1 and the rubber sheet 16 will not be displaced during the insertion.

Referring to FIGS. 17, 18 and 19, a completed piezoelectric device is shown. When the assembled body is completely inserted into the casing 18, the arm 28 of the terminal plate 17 engages into the recess 201 formed in the tall wall 20a. Thereafter, a sealant 35, such as synthetic resin, is injected into the casing 14 from its opening 32 to completely seal the casing 18. Since the tall wall 20a almost completely separates the cavity 33, the sealant 35 is filled in on only one side of the cavity 33 with a constant thickness and yet, hardly any sealant will intrude into the other side of the cavity 33 beyond the tall wall 20a. Furthermore, the sealing can be done with a small amount of sealant.

Generally, when sealing an opening, the sealing can be done with high reliability when the area of the opening is small. But in this case, when the area of the opening is small, it is difficult to insert a body through the opening. The present invention has solved this problem by presenting the assembled body in a shape similar to the wedge to facilitate the insertion of the assembled body into the casing 18 having a rather small opening. Thus, in the assembly line, the step for inserting the assembled body into the casing 18, as well as the step for injecting the sealant 35, can be done automatically with high reliability. Although the specification of Japanese Utility Model Laid-Open Publication (Jikkaisho) No. 52-82343 discloses a similar device as described above, it is silent as to arrange the assembled body in a shape similar to the wedge and also to the employment of the tall wall 20a.

To separate each piezoelectric resonating device from the belts 15a and 17a, the arms are cut along lines L2—L2 shown in FIG. 16.

Referring to FIG. 20, a modification of the terminal plate 17 is shown. The terminal plate 17 shown has the arm 28 so bent in a shape of "U" as to swerve the tall wall 20a and further extends towards the "H" shaped bar 29 in parallel relation to the arm 17b. The "H" shaped bar 29 extends parallel to the arm 17b and has an end portion bent slightly downwards as shown to facilitate the insertion of assembled body into the casing 18. According to the terminal plate 17 shown in FIG. 16, the projection 291 depresses down the piezoelectric resonating element 1 not straight downward but in an angled relation with a degree $\theta$. According to the modification of the terminal plate 17 shown in FIG. 20, however, the projection 291 depresses down the piezoelectric resonating element 1 straight downward, resulting in less displacement of the resonating element 1 during the insertion of the assembled body into the casing 18.

Figure 21:
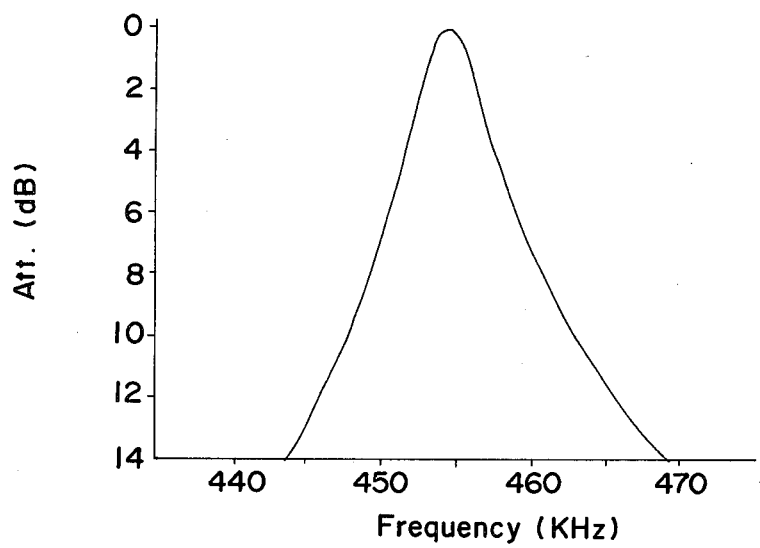
FIGS. 21 to 24 are graphs each showing a selectivity characteristic curve.
Figure 22:
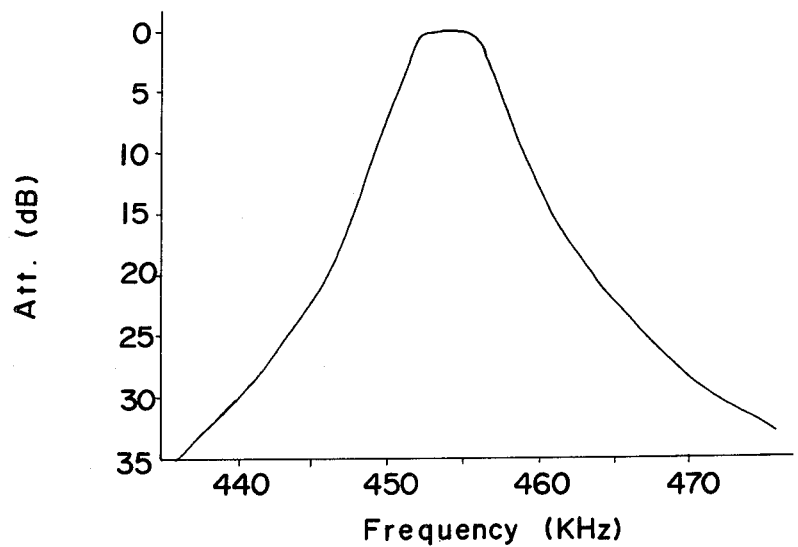
Figure 23:
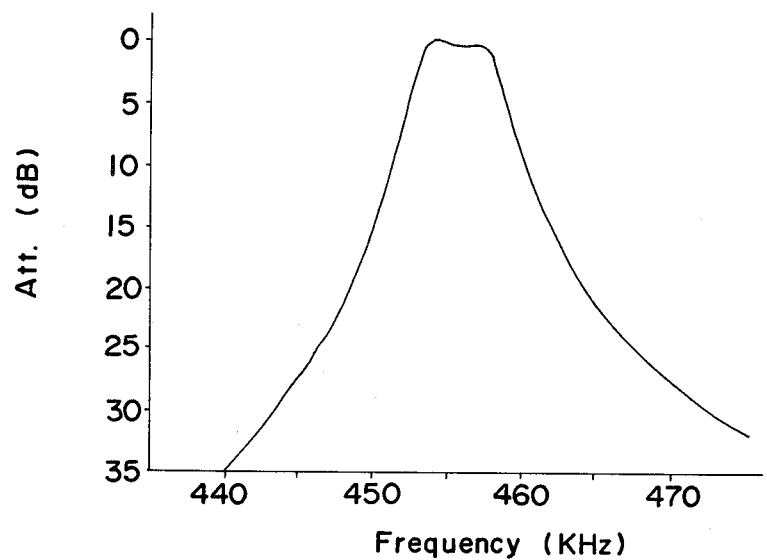
Figure 24:
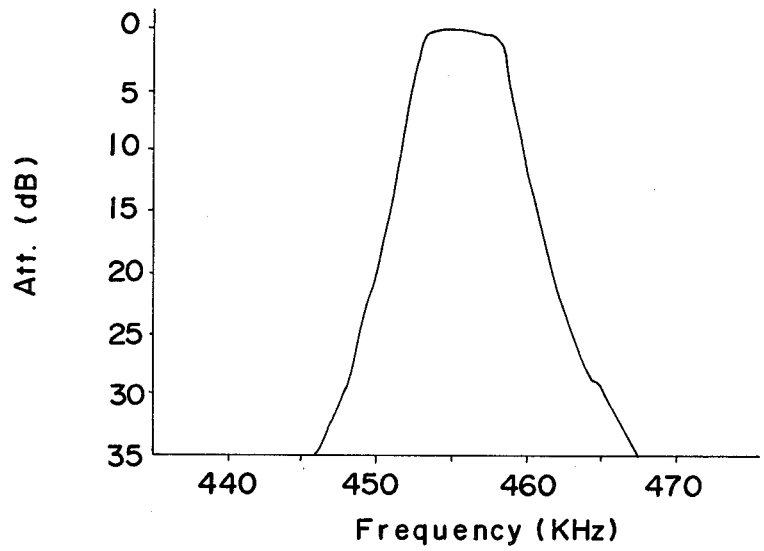

Referring to FIGS. 21 to 24, there are shown graphs of selectivity characteristic of different filters but each using the piezoelectric resonating element 1 of the present invention. In each graph, abscissa and ordinate represent frequency and attenuation, respectively. The graph of FIG. 21 shows a selectivity characteristic curve of a filter employing one piezoelectric resonating element 1 of the present invention. The graph of FIG. 22 shows a selectivity characteristic curve of a filter employing one piezoelectric resonating element 1 of the present invention coupled with one IF transformer (not shown). The graph of FIG. 23 shows a selectivity characteristic curve of a filter employing two piezoelectric resonating elements 1 of the present invention connected in series without inserting a coupling capacitor. And, the graph of FIG. 24 shows a selectivity characteristic curve of a filter employing two piezoelectric resonating elements 1 of the present invention connected in series without inserting a coupling capacitor and one IF transformer connected in series.

Figure 25:
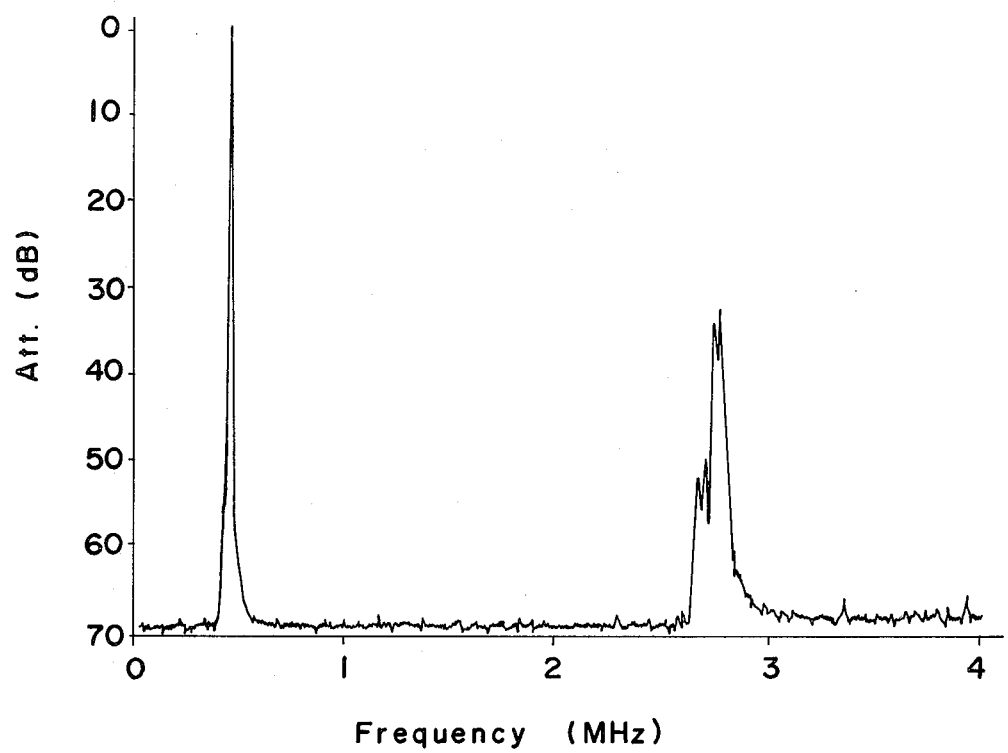
FIG. 25 is a graph showing a spurious characteristic curve.

Referring to FIG. 25 there is shown a graph of spurious characteristic of a filter employing two piezoelectric resonating elements 1 of the present invention and one IF transformer connected in series. In the graph of FIG. 25, abscissa and ordinate represent frequency and attenuation, respectively.

The piezoelectric resonating element 1 according to the present invention has following advantages.

Since the piezoelectric resonating element 1 of the present invention vibrates under lengthwise mode and can be formed by a single chip, the element itself can be presented in a compact size. More specifically, since the width of the element 1 according to the present invention is not greater than ¼ of its length L, the element 1 of the present invention has a size ¼, or smaller, of a prior art square 3-terminal type resonating element, provided that the square 3-terminal type resonating element has each side equal to L. When two elements are to be employed, the size will be reduced to ⅛ or smaller. Thus, as the number of elements to be employed increases, the degree of reduction of size becomes perceptible.

Since each chip of element 1 has a small size and can be manufactured at low cost, and since a plurality of chips of elements can be housed in a single casing, a grade-up of a piezoelectric resonating device employing a plurality of chips of elements can be accomplished without much increase of manufacturing cost and the size of casing.

Moreover, since the element 1 vibrates under lengthwise mode, the element 1 will not give rise to other modes of vibrations and, therefore, element 1 shows a good spurious characteristic particularly in long wave band and intermediate wave band (up to 2.5 MHz). Thus, the piezoelectric resonating element 1 of the present invention is particularly suitable for use in a filter of intermediate frequency band employed, e.g., in an AM receiver.

Since the piezoelectric resonating element 1 of the present invention has a high impedance, it is not susceptible to changes in external circuit constants.

Furthermore, since the element 1 vibrates under lengthwise mode, its impedance change will be very small even if the element 1 is replaced to change the central frequency. Thus, there is no need to change the type of a coupled IF transformer notwithstanding that the element 1 is changed.

Since two or more elements 1 can be coupled directly to each other without resulting in an over coupling, it is not necessary to employ any coupling capacitors. Thus, such coupling capacitors can be omitted, resulting in low manufacturing cost and compact in size.

Since a greater number of chips can be cut out from a single mother piece when compared with prior art elements that vibrates under modes other than lengthwise mode, the element of the invention saves natural sources and results in low manufacturing cost.

Moreover, since the groove 3 between the input and output electrodes 6 and 7 reduces the stray capacitance therebetween, the selectivity characteristic in high and low frequency regions about the central frequency can be presented in high symmetry when compared with a filter employing a 3-terminal square element that vibrates under expansion mode.

The method for manufacturing the piezoelectric resonating element 1 according to the present invention takes such an advantage that the steps for printing a pattern of electrodes for a plurality of elements 1 on a mother piece 101 by a regist ink, steps for removing unwanted portion of electrodes through etching, steps for cutting out chips of elements 1 from the mother piece 101, steps for smoothing cut edges, steps for classifying the cut out elements from the view point of central frequency, and steps for precisely adjusting the central frequency can be all done in a single step of forming grooves and cutting out chips by the use of dicing saw.

The piezoelectric resonating device according to the present invention has such advantages that since the assembled body is inserted into the casing through a small opening, the opening, after the insertion of assembled body, can be sealed with high reliability and that, because of the tall wall 20a, hardly any sealant will intrude into the cavity where piezoelectric resonating element 1 is installed.

Although the present invention has been fully described with reference to preferred embodiments, many modifications and variations thereof will now be apparent to those skilled in the art, and the scope of the present invention is therefore to be limited not by the details of the preferred embodiments described above, but only by the terms of appended claims.

What is claimed is:

1. A piezoelectric resonating element comprising:
   (a) a piezoelectric plate (2) having an elongated rectangular shape with first and second major flat surfaces, said piezoelectric plate (2) formed with an elongated groove (3) on said first major flat surface extending in an lengthwise direction of said piezoelectric plate (2) to separate said first major flat surface into first and second lands;
   (b) a first electrode (6) deposited on said first land;
   (c) a second electrode (7) deposited on said second land; and
   (d) a third electrode (12) deposited entirely on said second major flat surface.

2. A piezoelectric resonating element as claimed in claim 1, wherein said elongated groove (3) is formed by a dicing saw.

3. A piezoelectric resonating element comprising:
   (a) a piezoelectric plate (2) having an elongated rectangular shape of length L and first and second major flat surfaces, said piezoelectric plate formed with an elongated groove (3) on said first major flat surface extending in an lengthwise direction of said piezoelectric plate and additional grooves (4, 5) intercepting said elongated groove (3) at ⅓ of length L from the center of the first major flat surface to separate said first major flat surface into six lands;
   (b) a first electrode (6) deposited on one of two lands enclosed by said additional grooves (4, 5);
   (c) a second electrode (7) deposited on other of two lands enclosed by said additional grooves (4, 5); and
   (d) a third electrode (12) deposited entirely on said second major flat surface.

4. A piezoelectric resonating element as claimed in claim 3, wherein said elongated groove (3) and said additional grooves (4, 5) are formed by a dicing saw.

5. A piezoelectric resonating device comprising:
   (a) a piezoelectric resonating element (1) comprising:
      (i) a pieozoelectric plate (2) having an elongated rectangular shape with first and second major flat surfaces, said piezoelectric plate formed with an elongated groove (3) on said first major flat surface extending in an lengthwise direction of said piezoelectric plate to separate said first major flat surface at least into first and second lands;
      (ii) a first electrode (6) deposited on said first land;
      (iii) a second electrode (7) deposited on said second land; and
      (iv) a third electrode (12) deposited entirely on said second major flat surface
   (b) a base (14) for supporting said piezoelectric resonating element (1);
   (c) first, second and third terminal means having one ends connected to said first, second and third electrodes, respectively, and other ends extending outwardly from said base in the same direction;
   (d) a casing (18) defined by first and second major walls (18a and 18b) placed in face-to-face relation with each other and a side wall (18c, 18d, 18e) surrounding said major walls but leaving a section thereof to define a cavity (33) in said casing with an opening (32) at the side of said casing, said base (14), piezoelectric resonating element (1) and first, second and third terminal means being placed inside said casing (18) with said other ends of first, second and third terminal means being extending outwardly from said casing through said opening (32); and
   (e) a sealant (35) applied at said opening (32) for closing said casing (18).

6. A piezoelectric resonating device as claimed in claim 5, wherein said base (14) comprises a substrate (19) on which the piezoelectric resonating element (1) is supported and a separation wall (20a) standing on said substrate (19), said separation wall (20a) having recess means to receive said first, second and third terminal means, said separation wall (20a) separating said cavity into a space for accommodating said piezoelectric resonating element (1) and a space for injecting said sealant (35).

7. A piezoelectric resonating device as claimed in claim 5, wherein said third terminal means (17) is defined by a first portion (17b), a second portion (28) and a third portion (29) which are integrally formed with each other, said first and second portions being connected with a bent portion (30) such that first and second portions contain an acute angle before being inserted into said casing (18), so as to slant said third portion (29) in a manner of wedge to facilitate the insertion of said third terminal means (17), together with said base (14), piezoelectric resonating element (1) and first and second terminal means, into said casing (18).

8. A piezoelectric resonating device as claimed in claim 7, wherein said third portion (29) is defined by a beam extending perpendicularly to said second portion (28) and so bent in a shape of arc to present an expanding spring effect between said first major wall (18a) of the casing and said third electrode (12).

9. A piezoelectric resonating device as claimed in claim 8, wherein said third portion (29) is further defined by a projection (291) at a junction between said second and third portions (28, 29) for effecting an electric contact with said third electrode (12).

10. A piezoelectric resonating device as claimed in claim 5, wherein said third terminal means (17) is defined by a first portion (17b), a second portion (28) and a third portion (29) which are integrally formed with each other, said first and second portions being connected with a bent portion (30), said third portion being defined by a beam extending perpendicularly to said second portion (28), said beam having a portion slanted in a manner of wedge to facilitate the insertion of said third terminal means (17), together with said base (14), piezoelectric resonating element (1) and first and second terminal means, into said casing (18).

11. A piezoelectric resonating device as claimed in claim 10, wherein said beam extends perpendicularly to said second portion (28) and so bent in a shape of arc to present an expanding spring effect between said first major wall (18a) of the casing and said third electrode (12).

12. A piezoelectric resonating device as claimed in claim 11, wherein said third portion (29) is further defined by a projection (291) at a junction between said second and third portions (28, 29) for effecting an electric contact with said third electrode (12).

13. A piezoelectric resonating device as claimed in claim 5, further comprising an anisotropic conduction pliable sheet provided between said first electrode (6) and said first terminal means and between said second electrode (7) and said second terminal means.

* * * * *